United States Patent [19]

Kamon

[11] Patent Number: 5,432,588
[45] Date of Patent: Jul. 11, 1995

[54] SEMICONDUCTOR DEVICE AND METHOD OF MAKING THE SEMICONDUCTOR DEVICE

[75] Inventor: Kazuya Kamon, Hyogo, Japan

[73] Assignee: Mitsubishi Denk Kabushiki Kaisha, Tokyo, Japan

[21] Appl. No.: 239,966

[22] Filed: May 9, 1994

Related U.S. Application Data

[63] Continuation-in-part of Ser. No. 14,855, Feb. 8, 1993, Pat. No. 5,311,249.

[51] Int. Cl.$^6$ .................. G03B 27/72; G03B 27/42
[52] U.S. Cl. ............................. 355/71; 355/53
[58] Field of Search ............... 355/53, 67, 71; 359/566; 356/399

[56] References Cited

U.S. PATENT DOCUMENTS

| | | | |
|---|---|---|---|
| 5,144,362 | 9/1992 | Kamon et al. | 355/53 |
| 5,253,040 | 10/1993 | Kamon et al. | 356/399 |
| 5,311,249 | 5/1994 | Kamon et al. | 355/71 |
| 5,317,450 | 5/1994 | Kamon | 359/566 |
| 5,329,333 | 7/1994 | Noguchi et al. | 355/53 |
| 5,335,044 | 8/1994 | Shiraishi | 355/53 |
| 5,357,312 | 10/1994 | Tounai | 355/67 |
| 5,365,371 | 11/1994 | Kamon | 359/483 |
| 5,367,358 | 11/1994 | Kamon | 355/71 |

FOREIGN PATENT DOCUMENTS 61-91662  5/1986  Japan .

*Primary Examiner*—Richard A. Wintercorn
*Attorney, Agent, or Firm*—Leydig, Voit & Mayer

[57] ABSTRACT

A semiconductor device includes a semiconductor substrate having a surface; a plurality of spaced apart electrically insulating films disposed directly on the surface; a plurality of spaced apart electrically conducting word lines, at least one of the word lines being disposed on one of the insulating films and at least one of the word lines being disposed directly on the surface, the word lines being formed from a continuous layer of an electrically conducting material in a photolithographic process employing a photoresist film deposited on the continuous layer of electrically conducting material, the photoresist film being exposed in a single step to define masks for each of the word lines in a projection exposure apparatus including a light source for producing light; a condenser lens for condensing the light from the light source onto a mask including a circuit pattern; a projection lens having a pupil with a diameter, the projection lens for condensing the light that has passed through the mask onto a surface of a wafer; and an aperture member disposed between the light source and the condenser lens and having a transmission area with an outer diameter for shaping the light emanating from the light source and a light blocking area at a central portion of the transmission area, the outer diameter of the transmission area of the aperture member being set such that a ratio $\sigma$ of an outer diameter of an effective light source to the diameter of the pupil of the projection lens is 0.6±0.3 while a ratio of the light blocking area to the transmission area is 60±35%.

19 Claims, 10 Drawing Sheets

SEMICONDUCTOR DEVICE AND METHOD OF MAKING THE SEMICONDUCTOR DEVICE

This disclosure is a continuation-in-part of U.S. patent application Ser. No. 08/014,855, filed Feb. 8, 1993, now U.S. Pat. No. 5,311,249.

FIELD OF THE INVENTION

The present invention relates to a semiconductor device and a method of making a semiconductor device using a projection exposure apparatus for forming precise patterns.

DESCRIPTION OF RELATED ART

Figure 7:
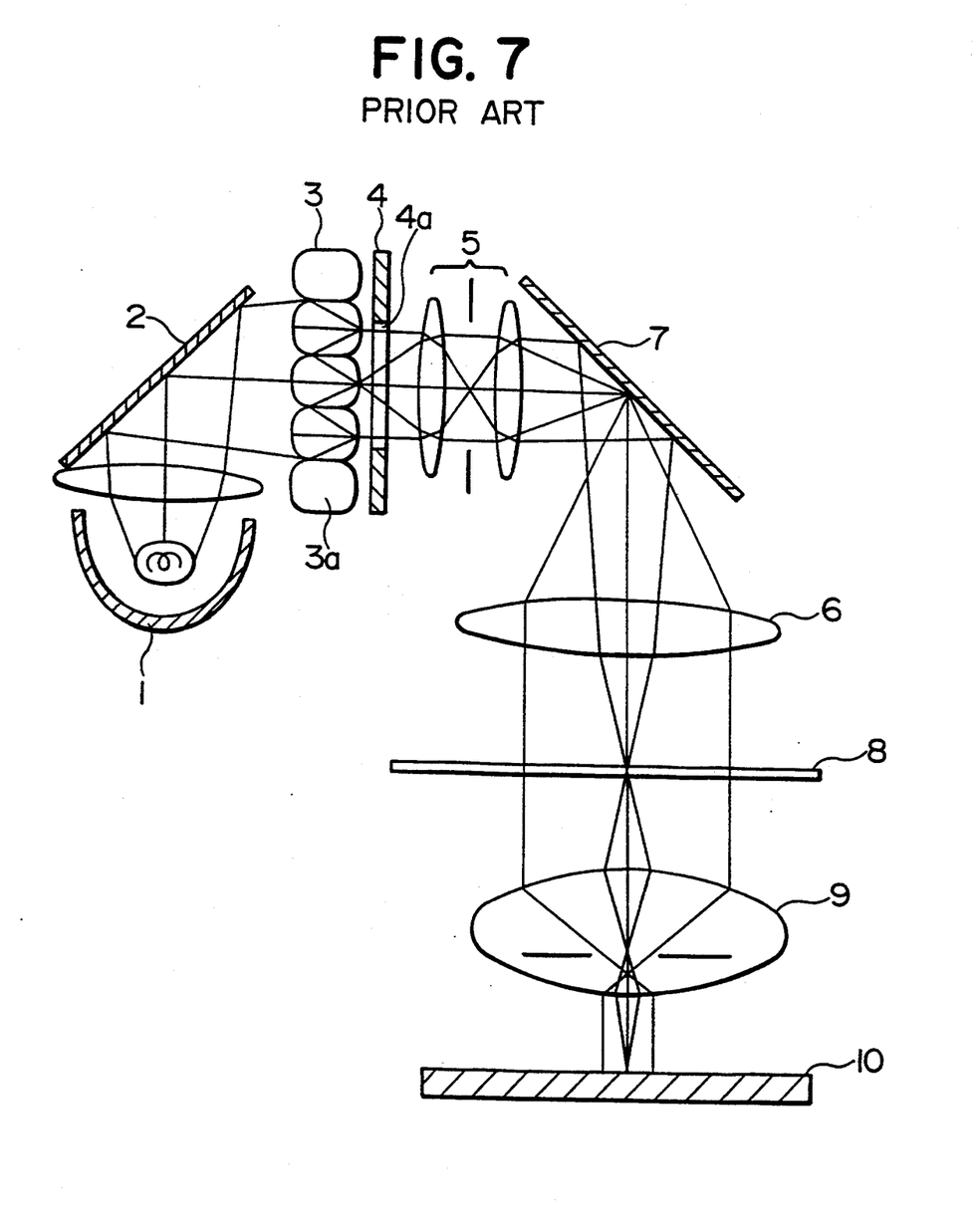
FIG. 7 shows the optical part of a conventional projection exposure apparatus.
Figure 8:
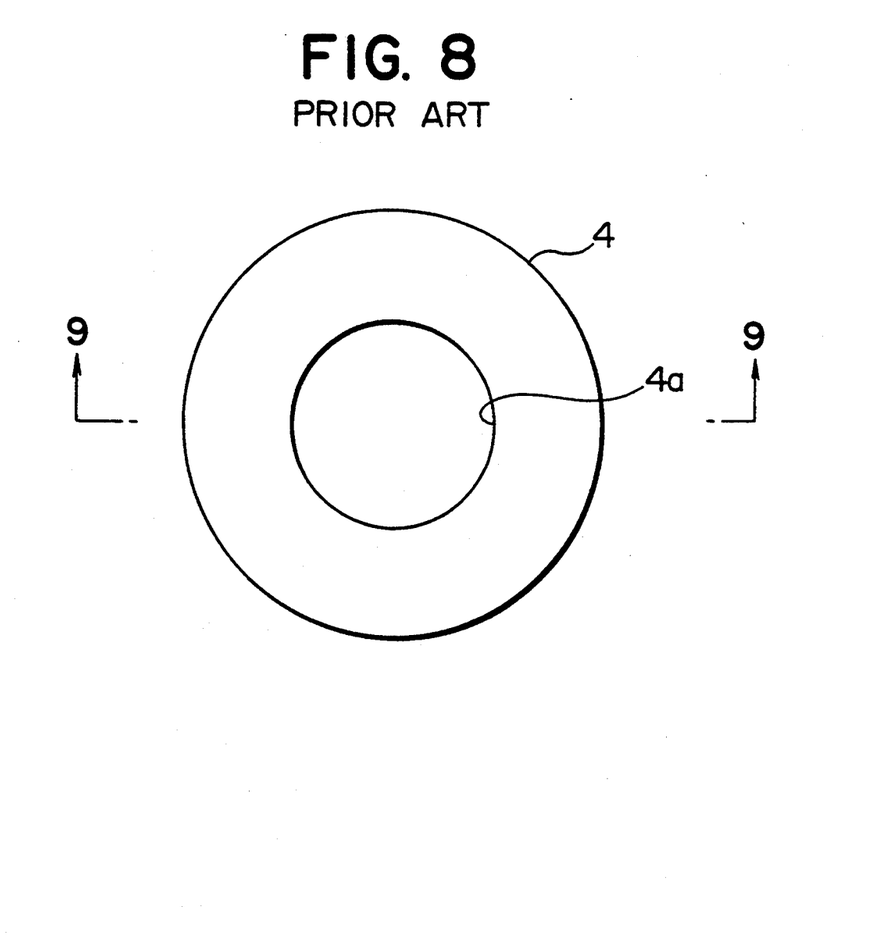
FIG. 8 is a plan view of an aperture member employed in the device of FIG. 6.
Figure 9:
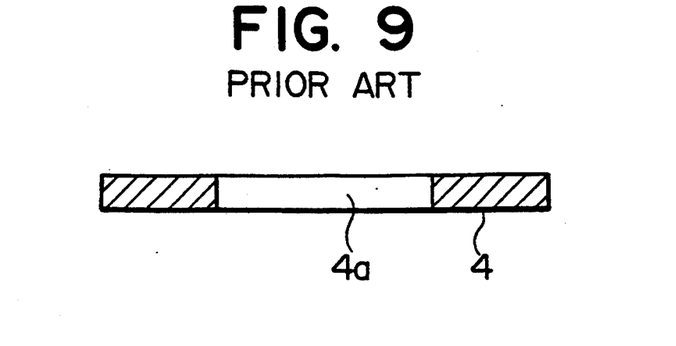
FIG. 9 is a cross-sectional view taken along the line 9—9 of FIG. 8.

FIG. 7 shows the optical parts of a conventional projection exposure apparatus including a lamp 1, a mirror 2, a fly eye lens 3 disposed in front of the lamp 1 with the mirror 2 between the lamp 1 and the fly eye lens 3, an aperture member 4 located in front of the fly eye lens 3, condenser lenses 5 and 6, a mirror 7, a photomask 8 including a circuit pattern, a projection lens 9, and a wafer 10 located in front of the photomask 8 with the projection lens 9 between the photomask 8 and the wafer 10. The aperture member 4 has a disk shape including a circular opening 4a, as shown in FIGS. 8 and 9.

Light rays emanating from the lamp 1 reach the fly eye lens 3 after reflection from the mirror 2 and are split into rays by the individual lenses 3a of the fly eye lens 3. The rays that have passed through the individual lenses 3a pass through the opening 4a of the aperture member 4, the condenser lens 5, are reflected from the mirror 7, and pass through the condenser lens 6 to illuminate the entire surface of the exposure area of the photomask 8. The rays from the individual lenses 3a of the fly eye lens 3 overlay one another on the surface of the photomask 8, and the photomask 8 is thus uniformly illuminated. The light rays that have passed through the photomask 8 in the manner described above pass through the projection lens 9 and reach the wafer 10, whereby transfer of the circuit pattern onto the surface of the wafer 10 is achieved.

In such a projection exposure apparatus, the minimum resolution R is proportional to $\lambda/NA$, where $\lambda$ is the wavelength of the light and NA is the numerical aperture. The resolution of the conventional projection exposure apparatus is improved by increasing the numerical aperture NA. However, although an increase in numerical aperture NA of the optical system improves the resolution R, it reduces the depth of focus (DOF) of the projection exposure apparatus. The depth of focus is proportional to $\lambda/NA^2$. The numerical aperture NA of the optical system is related to $\sin \theta$, where $\theta$ is the angle of incidence of the light incident on the wafer 10. Thus, the larger the angle of incidence $\theta$ with respect to the wafer 10, the shallower the depth of focus. Therefore, in a conventional projection exposure apparatus, an increase in the resolution reduces the depth of focus and thus reduces transfer accuracy.

Japanese Unexamined Published Patent Application 61-91662 describes a projection exposure apparatus that employs a ring-shaped aperture member. In this exposure apparatus, only the light that has passed through the peripheral portion of the aperture member is utilized by employing the ring-shaped aperture member. Consequently, the components of the first order diffracted light are blocked, whereby the numerical aperture NA of the optical system is reduced and, hence, the depth of focus is improved. As described in the publication, resolution is improved while the depth of focus is enlarged by employing only the light that passes though the outermost portion of the aperture member.

Figure 10:
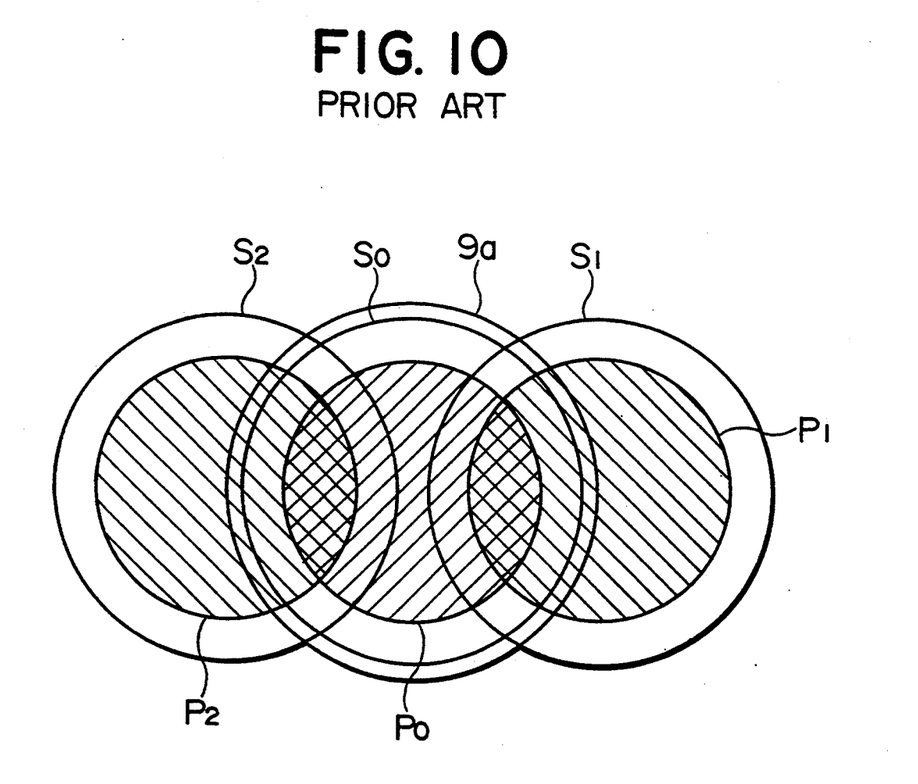
FIG. 10 shows light source images formed on a pupil of a projection lens in another conventional projection exposure apparatus.

However, when a large ring-shaped light source is employed so that only the light that passes through the outermost portion of the aperture member is used, as described in the publication, a light source image $S_0$ of the zeroth order and light source images $S_1$ and $S_2$ of $\pm$ first order are produced on the surface of a pupil $9a$ of the projection lens, as shown in FIG. 10. As a result, the angle of incidence of the light of the zeroth order is increased and, hence, the depth of focus is reduced. In FIG. 10, hatched areas $P_0$ through $P_2$ indicate the light blocked portions of the ring-shaped aperture member.

Thus, because of the trade-off between resolution and depth of focus, it is difficult or impossible to fabricate a semiconductor device using a single step photolithographic process with a resist on a surface that has many levels, i.e., is not planar, with the known optical exposure apparatus. If a precise pattern photomask including narrow linewidth elements is used, a wide depth of focus cannot be achieved if a precision pattern is to be formed. When such a precise photomask pattern must be focused on a non-planar resist, multiple masks and multiple exposure steps must be employed for different portions of the resist because of depth of focus limitations. The precise alignments required between steps is complex. Otherwise, pattern precision, i.e., the minimum linewidth of the pattern, must be sacrificed if a single step exposure photolithography process is to be used.

SUMMARY OF THE INVENTION

Accordingly, an object of the present invention is to provide a semiconductor device and a method of making a semiconductor device using projection exposure apparatus with improved resolution and enlarged depth of focus so that a photomask pattern can be precisely focused on a photoresist having parts at different levels exposed in a single exposure step.

According to a first aspect of the invention, a semiconductor device includes a semiconductor substrate having a surface; a plurality of spaced apart electrically insulating films disposed directly on the surface; a plurality of spaced apart electrically conducting word lines, at least one of the word lines being disposed on one of the insulating films and at least one of the word lines being disposed directly on the surface, the word lines being formed from a continuous layer of an electrically conducting material in a photolithographic process employing a photoresist film deposited on the continuous layer of electrically conducting material, the photoresist film being exposed in a single step to define masks for each of the word lines in a projection exposure apparatus comprising a light source for producing light; a condenser lens for condensing the light from the light source onto a mask including a circuit pattern; a projection lens having a pupil with a diameter, the projection lens for condensing the light that has passed through the mask onto a surface of a wafer; and an aperture member disposed between the light source and the condenser lens and having a transmission area with an outer diameter for shaping the light emanating from the light source and a light blocking area at a central portion of the transmission area, the outer diameter of the transmission area of the aperture member being set such that a ratio a of an outer diameter of an effective light source to the diameter of the pupil of the projection lens is 0.6±0.3 while a ratio of the light blocking area to the transmission area is 60±35%.

According to a second aspect of the invention, a method of making a semiconductor device includes forming a plurality of spaced apart electrically insulating films directly on the surface of a semiconductor substrate; depositing a continuous layer of an electrically conducting material directing on the surface and on the electrically insulating films; depositing a continuous photoresist film on the electrically conducting material and exposing the photoresist in a single light exposure step to define a first mask for forming a first word line directly on the surface and a second mask for forming a second word line on one of the electrically insulating films using a projection apparatus comprising a light source for producing light; a condenser lens for condensing the light from the light source onto a mask including a circuit pattern; a projection lens having a pupil with a diameter, the projection lens for condensing the light that has passed through the mask onto a surface of a wafer; and an aperture member disposed between the light source and the condenser lens and having a transmission area with an outer diameter for shaping the light emanating from the light source and a light blocking area at a central portion of the transmission area, the outer diameter of the transmission area of the aperture member being set such that a ratio σ of an outer diameter of an effective light source to the diameter of the pupil of the projection lens is 0.6±0.3 while a ratio of the light blocking area to the transmission area is 60±35%.

DESCRIPTION OF THE PREFERRED EMBODIMENTS

Figure 1:
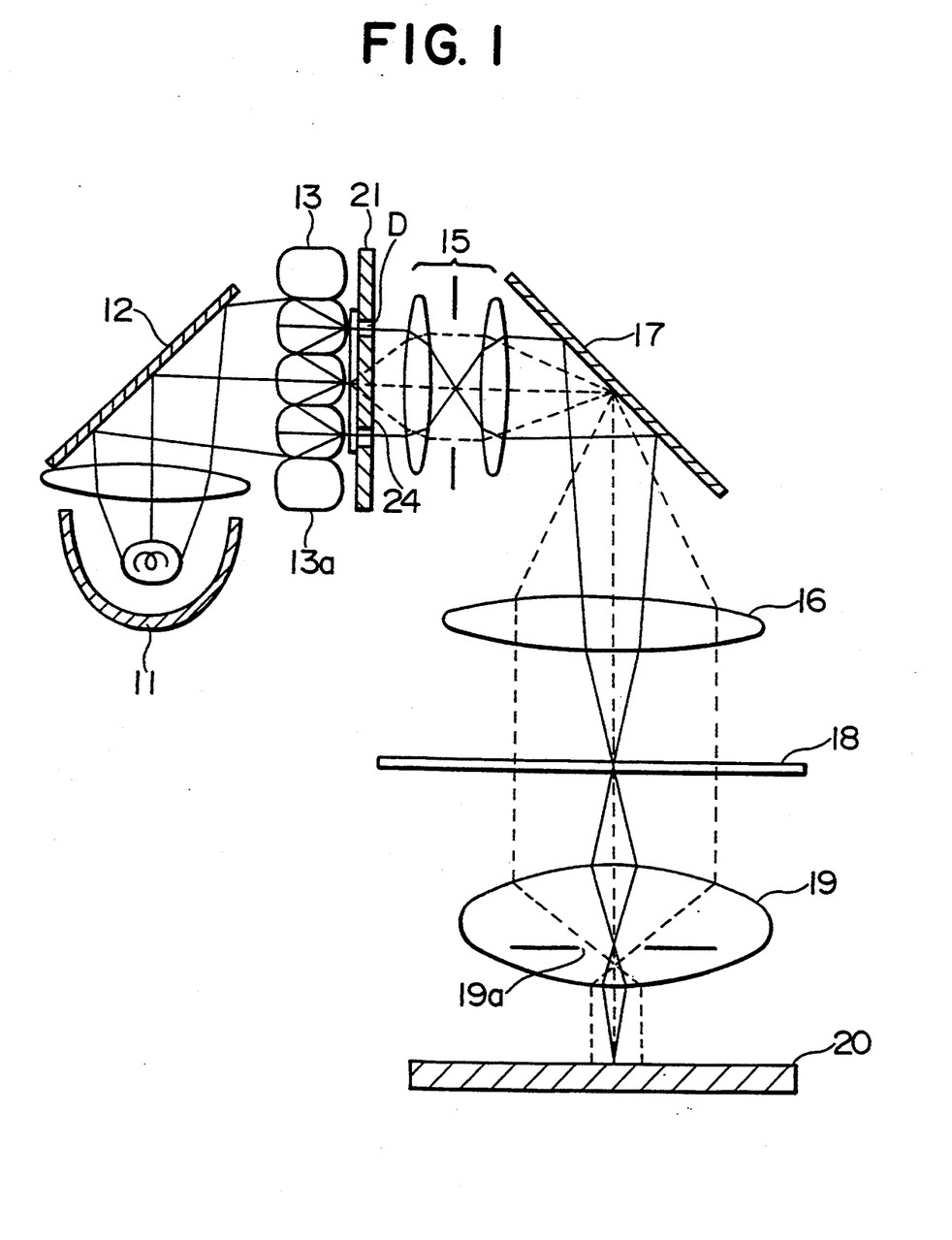
FIG. 1 shows the optical part of a projection exposure apparatus used according to a first embodiment of the present invention.

Referring first to FIG. 1, an exposure apparatus includes a lamp 11 for producing light having a wavelength of λ, a mirror 12, a fly eye lens 13 disposed in front of the lamp 11 with the mirror 12 between the lamp 11 and the fly eye lens 13, an aperture member 21 located in front of the fly eye lens 13, condenser lenses 15 and 16, a mirror 17, a photomask 18 for exposure including a circuit pattern, a projection lens 19, and a wafer located in front of the photomask 18 with the projection lens 19 between the photomask 18 and the wafer 20.

Figure 2:
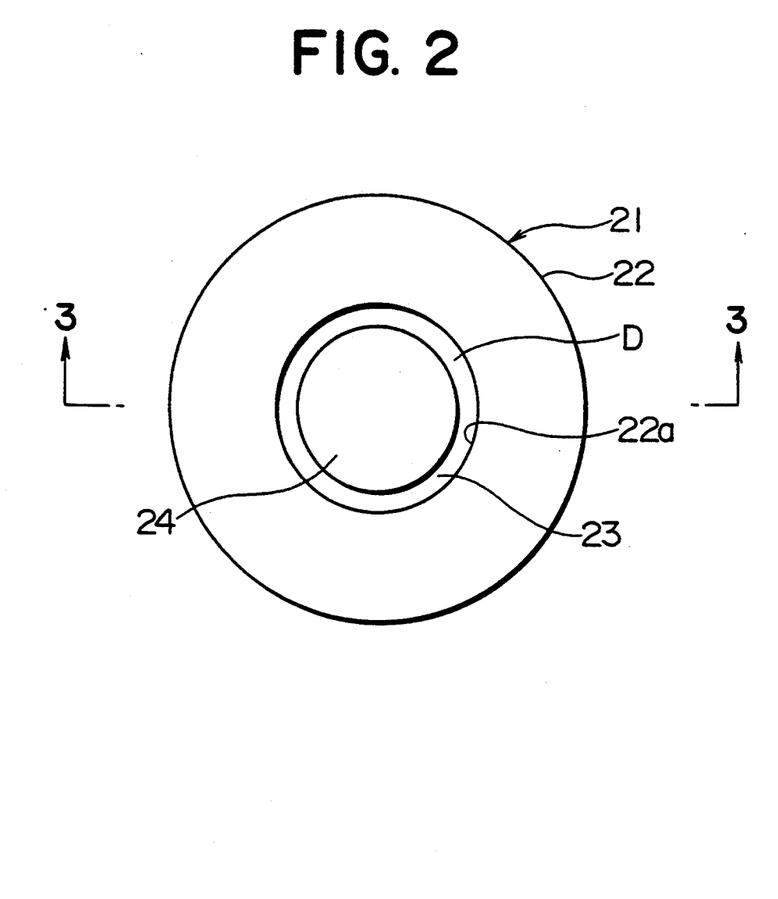
FIG. 2 is a plan view showing an aperture member employed in the projection exposure apparatus.
Figure 3:
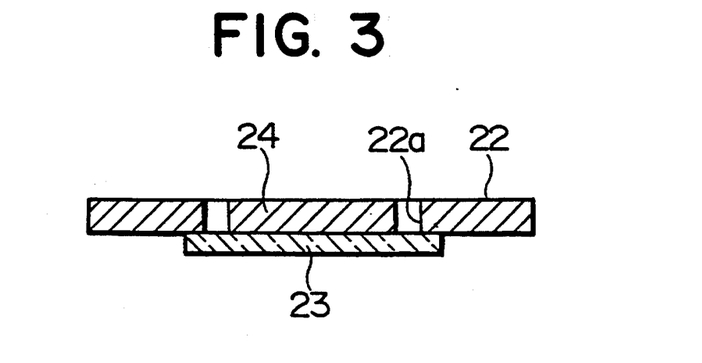
FIG. 3 is a cross-sectional view taken along the line 3—3 of FIG. 2.

As shown in FIGS. 2 and 3, the aperture member 21 includes an annular outer frame 22 having a centrally disposed circular opening 22a, a transparent member 23 that covers the entirety of the opening 22a in the outer frame 22, and a circular light blocking member 24 disposed on the surface of the transparent member 23 at the central portion of the opening 22a in the outer frame 22. The opening 22a in the outer frame 22 is a transmission area D that passes the light from the lamp 11 and the light blocking member 24 covers a light blocking area. The transmission area D has a size that ensures that the ratio σ of the outer diameter of the effective light source to the diameter of the pupil 19a is 0.6±0.3 on the surface of the pupil of the projection lens 19. The light blocking area has a light blocking rate r, expressed by the ratio of the light blocking area to the area of the opening 22a of the outer frame 22, of 60±35%.

Both the outer frame 22 and the light blocking member 24 are a metallic material, such as aluminum. The transparent member 23 is, for example, glass. The light blocking member 24 may be formed by depositing a metallic material on the transparent member 23.

The light emanating from the lamp 11 reaches the fly eye lens 13 through the mirror 12 and is split into beams corresponding to individual lenses 13a of the fly eye lens 13. The light rays emanating from the individual lenses 13a pass through the transmission area D of the aperture member 21, the condenser lens 15, the mirror 17, and the condenser lens 16 and illuminate the entire surface of the exposure area of the photomask 18. The light rays from the individual lenses 13a of the fly eye lens 13 overlay one another on the surface of the photomask 18, and the photomask surface is thus illuminated uniformly. The light that has passed through the photomask 18 reaches the wafer 20 through the projection lens 19, whereby transfer of the circuit pattern onto the surface of the wafer 20 is achieved.

Figure 4:
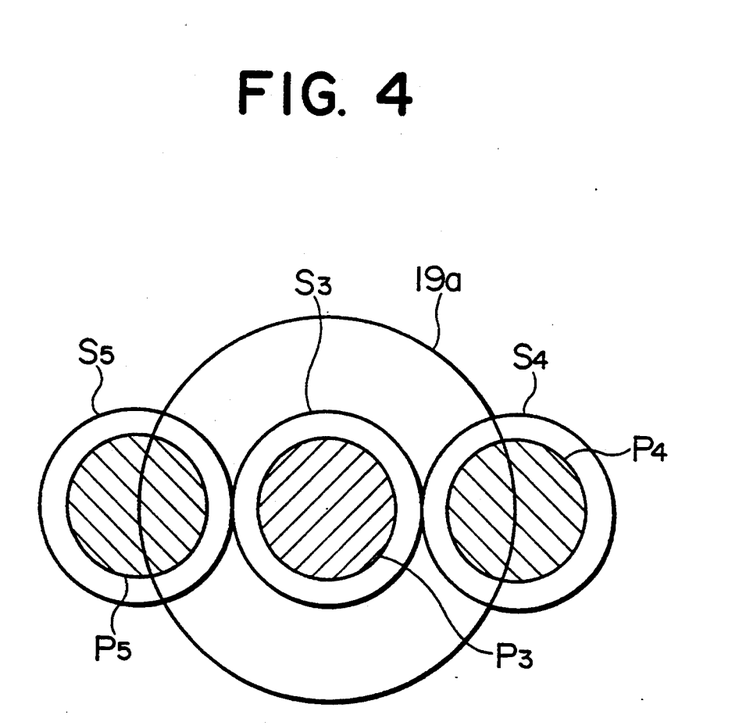
FIG. 4 shows light source images formed on a pupil of a projection lens.

FIG. 4 shows light source images formed on the pupil 19a of the projection lens 19 when the ratio a of the transmission area D of the aperture member 21 is 0.5, the light blocking rate r of the light blocking area is about 56%, and the circuit pattern of the photomask 18 has a line-and-space pattern close to the resolution limit of the projection lens. A light source image $S_3$ of the zeroth order is formed at the central portion of the pupil 19a, and light sources $S_4$ and $S_5$ of ± the first order are formed on the right and left sides of the light source image $S_3$ of the zeroth order, respectively. The light source images $S_3$ through $S_5$ respectively have circular light blocking portions $P_3$ through $P_5$ that are formed by the light blocking member 24 of the aperture member 21. The components of the diffracted light of the first order that are incident on the wafer 20 by virtue of the light blocking portions $P_4$ and $P_5$ of the light source images $S_4$ and $S_5$ having a large angle of incidence are blocked while the angle of incidence of the diffracted light of the zeroth order is not increased excessively. As a result, resolution is improved and enlargement of the depth of focus is suitably achieved.

Figure 5:
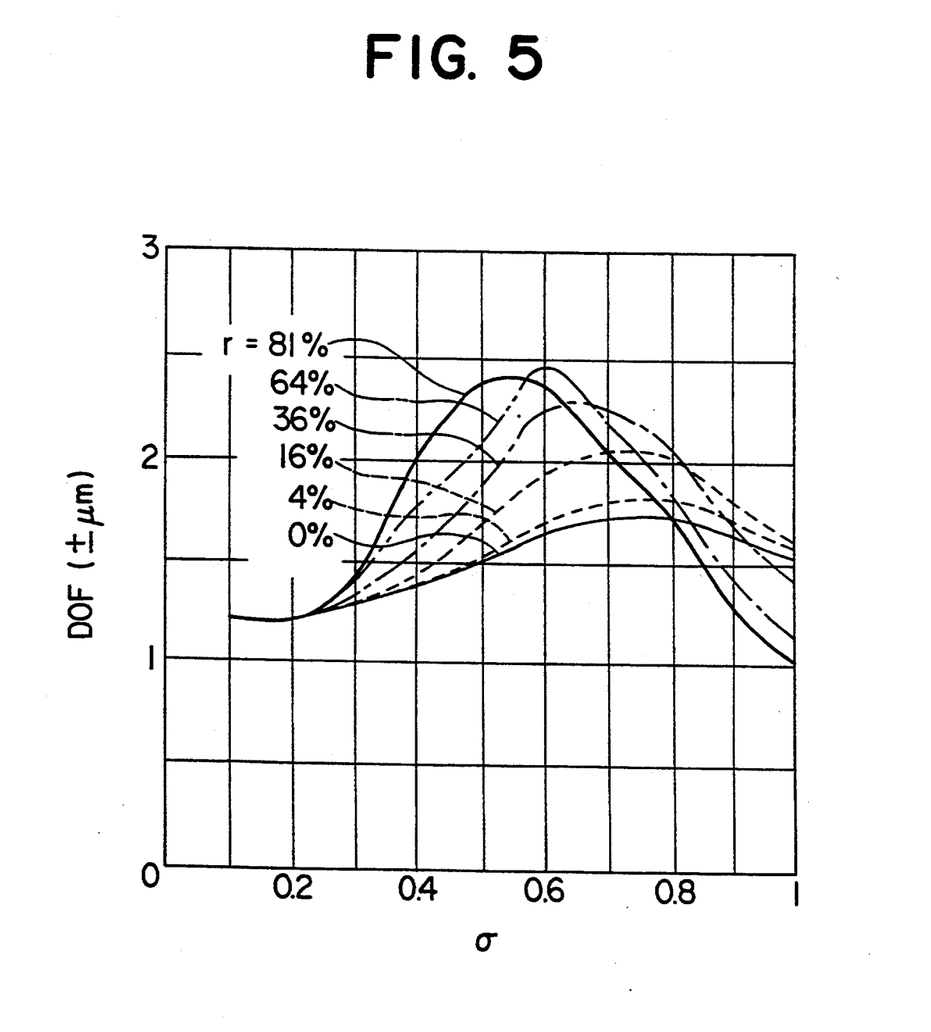
FIG. 5 shows the relationship between the ratio σ of the outer diameter of an effective light source to the diameter of a pupil of a projection lens and the depth of focus when the light blocking rate of a light blocking area of the aperture member varies.

FIG. 5 shows the relationship between the ratio $\sigma$ of the outer diameter of the effective light source to the diameter of the pupil of the projection lens 19 and the depth of focus obtained when the light blocking rate r of the light blocking area of the aperture member 21 varies. The results of the measurements using a line-and-space-pattern of 0.5 μm are shown in FIG. 5. The light blocking rate r was changed stepwise from 0% to 81%. It can be seen from FIG. 5 that an optimum ratio $\sigma$ exists at each of the light blocking rates. Particularly, when r=64% and $\sigma$=0.6, the depth of focus is enlarged the most. Hence, in the present invention, the optimum ratio $\sigma$ and that of the light blocking rate r which ensure an improvement in resolution and an enlargement of the depth of focus are 0.6±0.3 and 60±35%, respectively.

Figure 6:
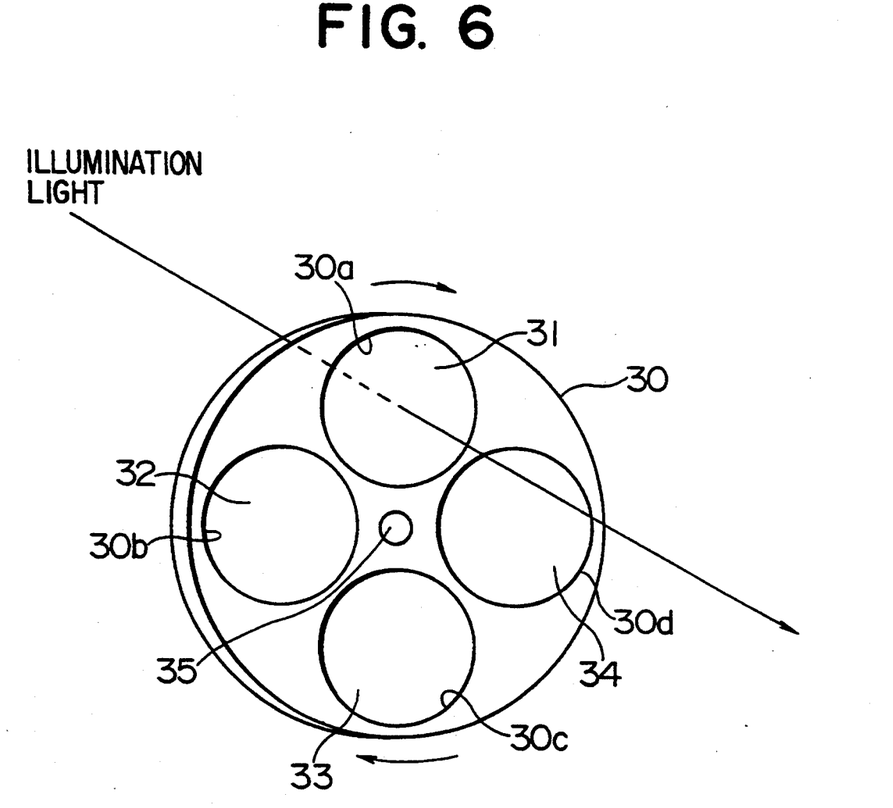
FIG. 6 shows a device employed in a projection exposure apparatus.

A single aperture member need not be fixed in the optical path of light and an aperture member suited to an exposure process and selected from a plurality of aperture members may be used. FIG. 6 shows a device used for such an arrangement. A disk-like substrate 30 has four openings including first, second, third, and fourth openings 30a through 30d. Different aperture members 31 through 33 are respectively provided in the first through fourth openings 30a through 30d. The aperture members 31 through 34 may differ in the shape or size of the transmission area and light blocking area or may not have the light blocking area at the central portion and have only the transmission area.

The substrate 30 is rotatable about a central axis 35. It is, therefore, possible to selectively locate any of the four openings 30a through 30d in the optical path of light by rotating the substrate 30. Accordingly, the optimum aperture member can be selected for each exposure process.

Figure 11:
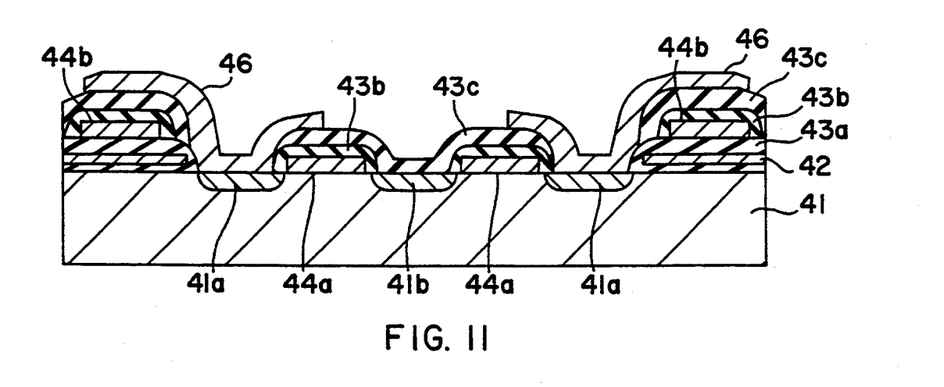
FIG. 11 is a cross-sectional view of a stacked memory cell according to an embodiment of the invention made using the novel projection exposure apparatus.

The novel projection exposure apparatus can be used for transferring precise patterns with narrow linewidths in the process of manufacturing various semiconductor devices. FIG. 11 is a sectional view illustrating such a semiconductor device, a stacked memory cell, produced using the projection exposure apparatus described above. The stacked memory cell includes source/drain electrodes 41a and 41b, each electrode comprising an n-type dopant impurity region within and at the surface of a p-type silicon substrate. In FIG. 11, two source/drain electrodes 41a are spaced apart with a single source/drain electrode 41b disposed between them. Electric field shields 42 embedded in a first insulating film 43a are also disposed on the surface of the p-type silicon substrate 41. A word line 44a is disposed between each pair of source/drain electrodes 41a and 41b. Word lines 44a are disposed directly on the surface of the p-type silicon substrate 41 and word lines 44b are disposed opposite respective electric field shields 42 with the first insulating film 43a separating each word line 44b from the corresponding electric field shield. Each of the word lines 44a and 44b comprises a polycrystalline silicon film covered with a second insulating film 43b. A third insulating film 43c covers the source/drain electrode 41b and the first and second insulating films 43a and 43b opposite the word lines 44a and 44b. The insulating films 43a, 43b, and 43c are preferably an oxide of silicon or silicon nitride. A respective storage node 46 comprising a polycrystalline silicon film is in contact with each source/drain electrode 41a. The storage nodes 46 also extend on the corresponding third insulating film 43c to positions opposite a pair of corresponding word lines 44a and 44b.

Figure 12A:
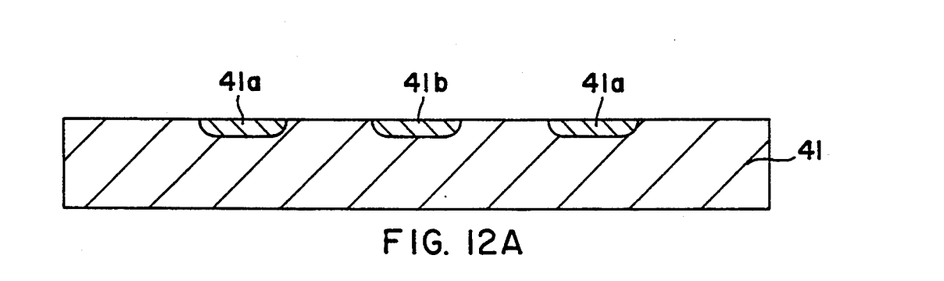
FIGS. 12A-12G illustrate steps in a method according to an embodiment of the invention of producing the stacked memory cell of FIG. 11 using the novel exposure apparatus.
Figure 12B:
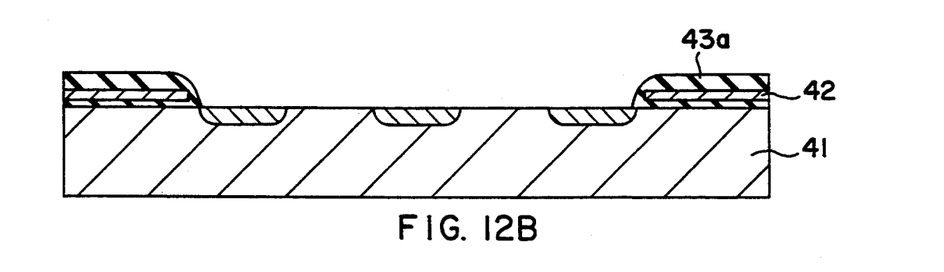

A stacked memory cell as shown in FIG. 11 is produced by the method illustrated in FIGS. 12A–12G. As shown in FIG. 12A, ions are first implanted into regions of the p-type silicon substrate 41 to form the n-type source/drain electrodes 41a and 41b. The first insulating films 43a and the electric field shields 42 are then formed on the surface of the p-type silicon substrate 41, as shown in FIG. 12B.

Figure 12C:
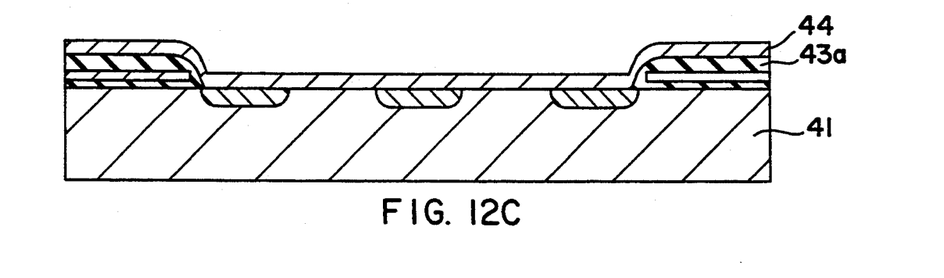
Figure 12D:
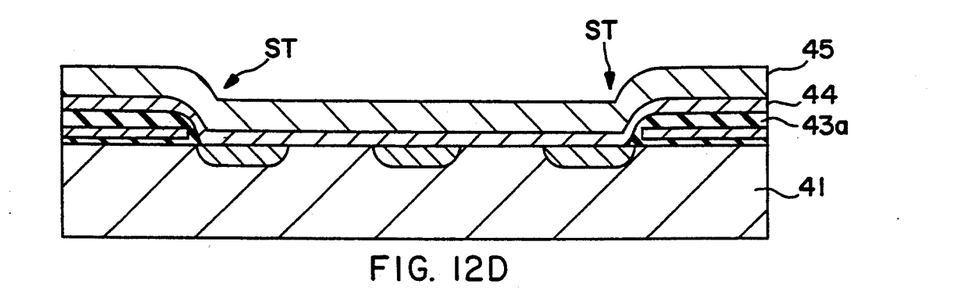
Figure 12E:
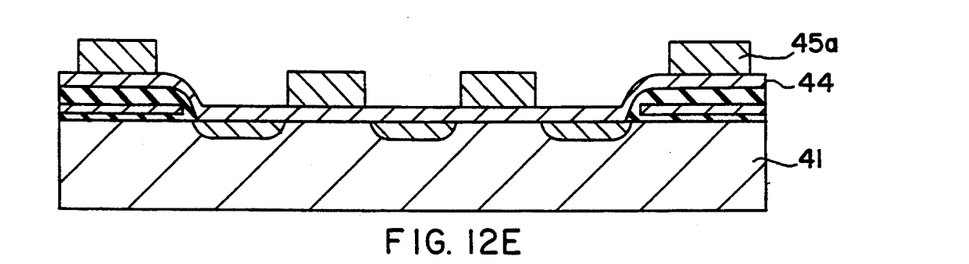

A polycrystalline silicon film 44 is then deposited on the whole surface, as shown in FIG. 12C, and a resist 45 is deposited on the polycrystalline silicon film 44, as shown in FIG. 12D. A mask including a pattern defining the word lines 44a and 44b is used to expose the resist 45 using the projection exposure apparatus shown in FIG. 1 to form the mask pattern on the resist. After exposure, the resist 45 is developed to complete resist patterns 45a and 45b corresponding to the word lines 44a and 44b, respectively, as shown in FIG. 12E.

Figure 12F:
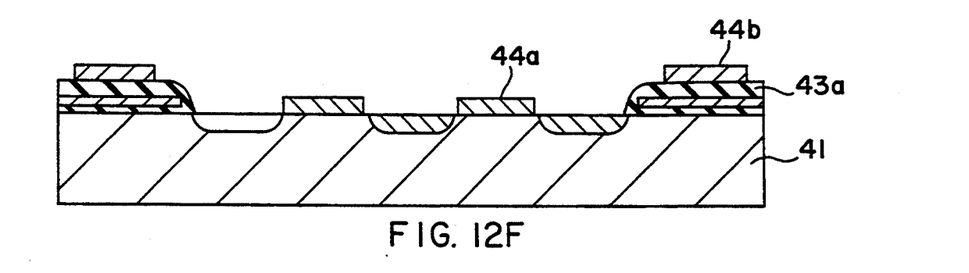
Figure 12G:
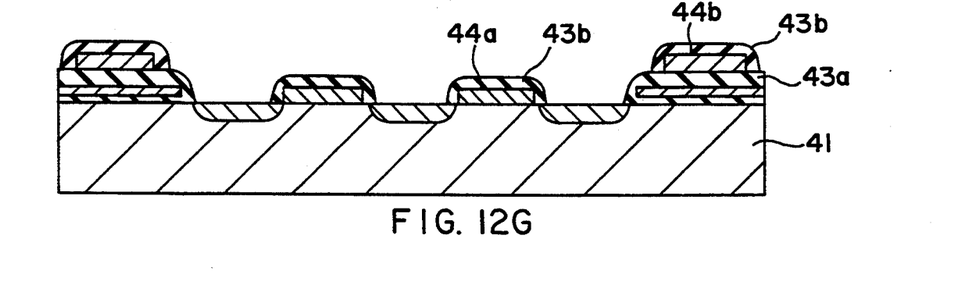

The polycrystalline silicon film 44 is etched using the resist patterns 45a and 45b as an etching mask to form the word lines 44a and 44b, as shown in FIG. 12F, and the resist patterns 45a and 45b are then removed. The second insulating film 43b is then formed on each of the word lines 44a and 44b, as shown in FIG. 12G. The third insulating film 43c is then formed on each of the source/drain electrodes 41b and the adjacent first and second insulating films 43a and 43b covering word lines 44a and 44b. A storage node 46 comprising a polycrystalline silicon film is formed on each of the surfaces of the source/drain electrodes 41a and on the adjacent third insulating films 43c to complete the memory cell shown.

In the process described, a step ST corresponding to each of the first insulating films 43a is reproduced in the resist 45, as shown in FIG. 12D. As a result, the resist patterns 45a and 45b for forming the word lines 44a and 44b are located at different levels, i.e., in different planes. Since the projection exposure apparatus shown in FIG. 1 achieves a large depth of focus and a high resolution, as described above, the apparatus can simultaneously accurately focus the word line mask pattern on the upper and lower parts of the resist 45, i.e., on opposite sides of each step ST. Thus, using the novel projection exposure apparatus, precise, narrow word lines 44a and 44b are formed on the upper and lower portions of the steps ST without dimensional variations and in a single exposure step. Similarly, high-precision, narrow line storage nodes and bit lines are formed using the novel projection exposure apparatus using respective single exposure steps in preparing etching masks from resist films.

The present invention can stably form a fine pattern and thus produce future generation semiconductor devices. Although it was formerly indispensable to use Hg-I beam light with a wavelength of 365 nm, KrF excimer laser light with a wavelength of 248 nm, and ArF excimer laser light with a wavelength of 193 nm as the light source for transferring DRAM patterns of 16 Mb-DRAMs, 64 Mb-DRAMs and 256 Mb-DRAMs, respectively, using the projection exposure apparatus and method of the present invention, 64 Mb-DRAMs, 256 Mb-DRAMs and 1 Gb-DRAMs can be produced using Hg-I beam, KrF excimer laser light, and ArF excimer laser light, respectively.

I claim:

1. A semiconductor device including:
a semiconductor substrate having a surface;
a plurality of spaced apart electrically insulating films disposed directly on the surface;
a plurality of spaced apart electrically conducting word lines, at least one of the word lines being disposed on one of the insulating films and at least one of the word lines being disposed directly on the surface, the word lines being formed from a continuous layer of an electrically conducting material in a photolithographic process employing a photoresist film deposited on the continuous layer of electrically conducting material, the photoresist film being exposed in a single step to define masks for each of the word lines in a projection exposure apparatus comprising:
a light source for producing light;
a condenser lens for condensing the light from the light source onto a mask including a circuit pattern;
a projection lens having a pupil with a diameter, the projection lens for condensing the light that has passed through the mask onto a surface of a wafer; and
an aperture member disposed between the light source and the condenser lens and having a transmission area with an outer diameter for shaping the light emanating from the light source and a light blocking area at a central portion of the transmission area, the outer diameter of the transmission area of the aperture member being set such that a ratio $\sigma$ of an outer diameter of an effective light source to the diameter of the pupil of the projection lens is 0.6±0.3 while a ratio of the light blocking area to the transmission area is 60±35%.

2. The semiconductor device of claim 1 wherein the projection exposure apparatus comprises the aperture member including an annular frame having a circular central opening, a transparent member covering the opening of the annular frame, and a circular light blocking member disposed on the transparent member at a central portion of the opening of the annular frame.

3. The semiconductor device of claim 2 wherein the annular frame and the light blocking member are a metallic material and the transparent member is glass.

4. The semiconductor device of claim 1 wherein the projection exposure apparatus comprises a plurality of aperture members having different ratios $\sigma$ and different light blocking ratios of the light blocking areas to the transmission area and a device for selectively locating one of the plurality of aperture members in an optical path of the light.

5. The semiconductor device of claim 4 wherein the projection exposure apparatus wherein the device has a rotatable disk substrate including a plurality of openings, the aperture members being mounted in respective openings.

6. The semiconductor device of claim 1 wherein the electrically conducting material is polycrystalline silicon.

7. The semiconductor device of claim 1 wherein the electrically insulating film is selected from the group consisting of silicon oxide and silicon nitride.

8. The semiconductor device of claim 1 including a second electrically insulating film covering the word lines.

9. The semiconductor device of claim 8 including spaced apart source/drain electrode regions in the substrate, word lines on the substrate between the source/drain electrode regions, and electrically conducting storage nodes contacting respective source/drain electrode regions and disposed on the second electrically insulating films.

10. A method of making a semiconductor device comprising:
forming a plurality of spaced apart electrically insulating films directly on the surface of a semiconductor substrate;
depositing a continuous layer of an electrically conducting material directing on the surface and on the electrically insulating films;
depositing a continuous photoresist film on the electrically conducting material and exposing the photoresist in a single light exposure step to define a first mask for forming a first word line directly on the surface and a second mask for forming a second word line on one of the electrically insulating films using a projection apparatus comprising:
a light source for producing light;
a condenser lens for condensing the light from the light source onto a mask including a circuit pattern;
a projection lens having a pupil with a diameter, the projection lens for condensing the light that has passed through the mask onto a surface of a wafer; and
an aperture member disposed between the light source and the condenser lens and having a transmission area with an outer diameter for shaping the light emanating from the light source and a light blocking area at a central portion of the transmission area, the outer diameter of the transmission area of the aperture member being set such that a ratio $\sigma$ of an outer diameter of an effective light source to the diameter of the pupil of the projection lens is 0.6±0.3 while a ratio of the light blocking area to the transmission area is 60±35%.

11. The method of claim 10 including developing the photoresist film to form the first and second masks on the electrically conducting film and etching the electrically conducting film where not masked, thereby forming the first and second word lines.

12. The method of claim 10 wherein the projection exposure apparatus exposing the photoresist film comprises the aperture member including an annular frame having a circular central opening, a transparent member covering the opening of the annular frame, and a circular light blocking member disposed on the transparent member at a central portion of the opening of the annular frame.

13. The method of claim 12 wherein the annular frame and the light blocking member are a metallic material and the transparent member is glass.

14. The method of claim 10 wherein the projection exposure apparatus comprises a plurality of aperture members having different ratios $\sigma$ and different light blocking ratios of the light blocking areas to the transmission area and a device for selectively locating one of the plurality of aperture members in an optical path of the light.

15. The method of claim 14 wherein the device has a rotatable disk substrate including a plurality of openings, the aperture members being mounted in respective openings.

16. The method of claim 10 including, before forming the electrically insulating films, forming spaced apart source/drain electrode regions in the substrate.

17. The method of claim 16 including forming the first word line between respective source/drain electrode regions.

18. The method claim 11 including, after forming the first and second word lines, forming a second electrically insulating film covering the first and second word lines.

19. The method of claims 18 including forming at least one storage node contacting one of the source/drain electrode regions in the substrate and extending over adjacent second electrically insulating films covering the first and second word lines.

* * * * *

UNITED STATES PATENT AND TRADEMARK OFFICE
CERTIFICATE OF CORRECTION

PATENT NO. : 5,432,588
DATED : July 11, 1995
INVENTOR(S) : Kazuya Kamon

It is certified that error appears in the above-indentified patent and that said Letters Patent is hereby corrected as shown below:

Item [73], Assignee, change "Mitsubishi Denk Kabushiki Kaisha" to --Mitsubishi Denki Kabushiki Kaisha--.

Signed and Sealed this

Third Day of October, 1995

Attest:

BRUCE LEHMAN

Attesting Officer

Commissioner of Patents and Trademarks